(12) United States Patent
Dai et al.

(10) Patent No.: US 8,769,470 B2
(45) Date of Patent: Jul. 1, 2014

(54) TIMING CLOSURE IN CHIP DESIGN

(75) Inventors: Hongwei (Nick) Dai, Shanghai (CN); Chen Du, Shanghai (CN); Xian E He, Shanghai (CN); Jian Niu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/296,555

(22) Filed: Nov. 15, 2011

(65) Prior Publication Data

US 2012/0137263 A1    May 31, 2012

(30) Foreign Application Priority Data

Nov. 29, 2010    (CN) .......................... 2010 1 0577022

(51) Int. Cl.
  *G06F 17/50*    (2006.01)
  *G06F 9/455*    (2006.01)

(52) U.S. Cl.
  USPC ........... 716/134; 716/108; 716/111; 716/113; 716/115; 716/132

(58) Field of Classification Search
  USPC .................. 716/108, 111, 113, 115, 132, 134
  See application file for complete search history.

(56) References Cited

U.S. PATENT DOCUMENTS

| | | | | |
|---|---|---|---|---|
| 5,371,851 A * | 12/1994 | Pieper et al. | .................. | 345/501 |
| 6,480,991 B1 * | 11/2002 | Cho et al. | ...................... | 716/122 |
| 6,614,714 B2 * | 9/2003 | Hsu et al. | ................. | 365/189.17 |
| 6,637,014 B2 * | 10/2003 | Casavant | ....................... | 716/114 |
| 6,910,197 B2 | 6/2005 | Nair | | |
| 6,920,625 B2 * | 7/2005 | Gass | .............................. | 716/113 |
| 7,020,589 B1 | 3/2006 | Datta et al. | | |
| 7,111,259 B2 * | 9/2006 | Casavant | ....................... | 716/115 |
| 7,117,457 B2 * | 10/2006 | Frenkil | ......................... | 716/113 |
| 7,251,797 B2 * | 7/2007 | Becer et al. | ................... | 716/113 |
| 7,325,217 B2 * | 1/2008 | Yoda | ............................. | 716/115 |
| 7,581,201 B2 * | 8/2009 | Kazda et al. | .................. | 716/113 |
| 7,603,600 B2 | 10/2009 | Satusukawa | | |
| 7,739,640 B2 * | 6/2010 | Abbaspour et al. | ........... | 716/113 |
| 7,774,729 B1 * | 8/2010 | Neto | ............................. | 716/108 |
| 7,810,053 B2 * | 10/2010 | Bushnell et al. | .............. | 716/108 |
| 7,853,911 B1 * | 12/2010 | Fung et al. | .................... | 716/113 |
| 8,086,983 B2 * | 12/2011 | Shrivastava et al. | .......... | 716/115 |
| 8,205,181 B1 * | 6/2012 | Singla et al. | .................. | 716/113 |
| 8,219,952 B2 * | 7/2012 | Tehrani et al. | ................ | 716/113 |
| 8,269,545 B2 * | 9/2012 | Chawla et al. | ................ | 327/262 |

(Continued)

OTHER PUBLICATIONS

Pan et al. "Timing Yield Estimation Using Statistical Static Timing Analysis" 0-7803-8834-8/05, IEEE, pp. 2461-2464.

*Primary Examiner* — Helen Rossoshek
(74) *Attorney, Agent, or Firm* — David A. Cain

(57) ABSTRACT

Disclosed are a method and system for improving timing closure in chip design. The method comprises: identifying a critical timing path in a chip design pattern, wherein a timing window of the critical timing path is smaller than a predetermined timing window; determining a variation of each segment of the critical timing path, wherein the variation indicates uncertainty of delay of a device and/or a wire caused by one or more factors; and changing at least one segment of the critical timing path based on the variation of each segment of the critical timing path to enlarge the timing window of the critical timing path. The method and system may enlarge a timing window of a critical timing path by reducing the variation thereof, thereby achieving timing closure in the chip design pattern.

17 Claims, 6 Drawing Sheets

(56) References Cited

U.S. PATENT DOCUMENTS

| | | |
|---|---|---|
| 2005/0268258 A1* | 12/2005 | Decker .............................. 716/4 |
| 2006/0101363 A1 | 5/2006 | Fry et al. |
| 2007/0266285 A1* | 11/2007 | Boerstler et al. .............. 714/731 |
| 2010/0042955 A1 | 2/2010 | Kotecha et al. |
| 2010/0153896 A1 | 6/2010 | Sewall et al. |
| 2012/0102447 A1* | 4/2012 | Tsai .............................. 716/134 |
| 2012/0124534 A1* | 5/2012 | Kalafala et al. ............... 716/108 |

* cited by examiner

TIMING CLOSURE IN CHIP DESIGN

TECHNICAL FIELD

Embodiments of the present invention generally relate to integrated circuit chip design, and particularly, to methods and systems for improving timing closure in chip design.

DESCRIPTION OF THE RELATED ART

Timing analysis generally means that a designer proposes some specific requirements or timing constraints, and uses a specific timing model to analyze a chip design layout document. In chip design, timing analysis is critical. Particularly, along with improvement of time frequency, a valid read and write timing window left for data transmission becomes smaller and smaller. An accurate timing analysis must be conducted if data is expected to be entirely transmitted from a transmitter to a receiver in a very short period of time.

Timing closure in the chip design usually means that the timing is designed consistently in the front and in the rear. That is, with respect to a specific timing requirement prescribed by the designer during a design stage, the chip can still meet the designed timing requirement upon completion of layout and wiring and extraction of parasitic parameters. However, in general, in chip design, the designer does not or cannot take into consideration accurate wire and device delay information during the design stage, so it is very possible that the timing after the layout does not close. A chip design layout capable of achieving timing closure may be delivered to a chip manufacturer to produce chips after signing off.

In recent years, as processes improve, wire delay and device delay are increasingly predominant, and the timing closure issue is becoming more frequent and serious. In a manufacturing process of 32 nanometers, 45 nanometers or the like, influences of inter-die violations and intra-die violations have already become significant. However, the chip design method in the prior art is not as desired in terms of speed and efficiency of timing closure, thereby causing an increase of chip design cost and other possible relevant issues.

SUMMARY OF THE INVENTION

Therefore, there exists a need for a method and system capable of efficiently and quickly improving timing closure in the chip design.

In one embodiment, the present invention provides a method for improving timing closure in chip design. The method comprises steps of: identifying a critical timing path in a chip design pattern, wherein a timing window of the critical timing path is smaller than a predetermined timing window; determining a variation of each segment of the critical timing path, wherein the variation indicates uncertainty of delay of a device and/or a wire caused by one or more factors; and changing at least one segment of the critical timing path based on the variation of each segment of the critical timing path to enlarge the timing window of the critical timing path.

In another embodiment, the present invention provides a system for improving timing closure in chip design. The system comprises: critical path identifying means configured to identify a critical timing path in a chip design pattern, wherein a timing window of the critical timing path is smaller than a predetermined timing window; variation determining means configured to determine a variation of each segment of the critical timing path, wherein the variation indicates uncertainty of delay of a device and/or a wire caused by one or more factors; and path changing means configured to change at least one segment of the critical timing path based on the variation of each segment of the critical timing path to enlarge the timing window of the critical timing path.

In a further embodiment, the present invention provides a computer readable medium on which a computer program for implementing a method for improving timing closure in the chip design according to the present invention is tangibly carried.

Various embodiments of the present invention may improve timing closure speed and efficiency during chip design. Other features and advantages of the present invention will be made more obvious by describing embodiments of the present invention with reference to the drawings.

BRIEF DESCRIPTION OF THE DRAWINGS

Other objects and effects of the present invention will become more apparent and comprehensible through the detailed description with reference to the following drawings.

In the figures, identical reference signs denote identical, similar or corresponding features or functions.

DETAILED DESCRIPTION OF EMBODIMENTS

Various embodiments of the present invention are described in detail with reference to the drawings. The flowcharts and block diagrams in the figures illustrate the system, methods, as well as architecture, functions and operations executable by a computer program product according to the embodiments of the present invention. In this regard, each block in the flowcharts or block may represent a module, a program, or a part of code, which contains one or more executable instructions for performing specified logic functions. It should be noted that in some alternatives, functions indicated in blocks may occur in an order differing from the order as illustrated in the figures. For example, two blocks illustrated consecutively may be actually performed in parallel substantially or in an inverse order, which depends on related functions. It should also be noted that block diagrams and/or each block in the flowcharts and a combination of thereof may be implemented by a dedicated hardware-based system for performing specified functions/operations or by a combination of dedicated hardware and computer instructions.

In an embodiments of the present invention, a critical timing path in a chip design layout is identified from a chip design pattern document to be signed off, wherein the critical timing path refers to a timing path whose timing window is smaller than a predetermined timing window; a variation of each segment of the critical timing path is determined; and at least one segment (for example, a device or a wire) of the critical timing path is changed based on the variation of each segment of the critical timing path to enlarge the timing window of the critical timing path. The above procedure may be repeated until no critical timing path exists in the chip design layout any longer, so as to complete the signing off of the chip design layout. In another embodiment, the critical timing path may be identified in a netlist design pattern, a layout design pattern and a wiring design pattern which are generated, and a segment of the critical timing path is modified by using the method to improve the timing closure.

Some concepts are explained first as below in order to better describe embodiments of the present invention.

Figure 3:
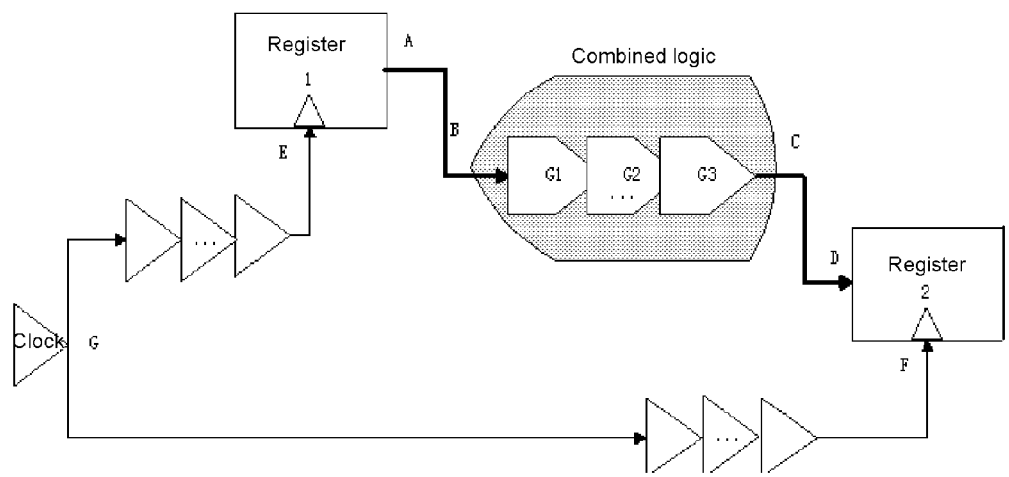
FIG. 3 illustrates a schematic view of a part of a chip design pattern.

A chip design pattern, for example, a file compiled in a hardware description language, comprises a netlist design pattern, a layout design pattern, a wiring design pattern and the like. The chip design pattern may comprise a plurality of "paths" and each of them comprises one or more segments, each "segment" comprising a device, a wire or the like. A path starts and ends with two different registers. FIG. 3 illustrates a schematic view of a part of a chip design pattern. In the example as shown in FIG. 3, a path is exemplarily drawn between a register 1 and a register 2, which comprises a wire AB, a device G1, a device G2, a device G3, and a wire CD.

Assuming that the register 1 in FIG. 3 sends data, and the register 2 receives the data and samples the received data according to a local clock. Because the data passes through the devices G1, G2, and G3 and the wires during transmission from the register 1 to the register 2, delay will be caused and a stable transmission of data will be affected.

The stable transmission of the data must meet requirements of a setup time and a hold time. The setup time refers to a time period between an instant when the data reaches stability and the rising edge of a clock signal, before the rising edge of the clock signal of the register; if the setup time is insufficient, the data cannot enter the register at the clock rising edge. The hold time refers to a time period in which the data is stable after the rising edge of the clock signal of the register; if the hold time is insufficient, the data cannot enter the register at the clock rising edge either.

Due to uncertainty related to manufacturing process, the delay of each device or wire in the circuit has a range of values, not a certain value. An early mode delay refers to a delay of the device or wire in the "quickest" mode during the manufacturing; and a late mode delay refers to a delay of the device or wire in the "slowest" mode during the manufacturing. The value of the late mode delay is generally larger than that of the early mode delay. The value of the early mode delay and the value of the late mode delay may be obtained from timing analysis result. For example, six values may be obtained at the register 2: a data late mode arrival time (AT) (i.e., the latest arrival time of the data), a data early mode AT (i.e., the earliest arrival time of the data), a clock late mode AT, a clock early mode AT, a setup guard time, and a hold guard time. The following exemplarily describes how to use the six values to judge whether the requirements of the setup time and hold time are met.

(1) Setup check: judging whether the data late mode AT is one setup guard time earlier than the clock early mode AT (i.e., a clock rising edge AT, which is equal to the data early mode AT); if so, it can be determined that the requirements of the setup time are met; if not, it can be determined that the requirements of the setup time are not met.

(2) Hold check: judging whether the data early mode AT is one hold guard time later than the clock late mode AT (i.e., a clock rising edge AT, which is equal to the data late mode AT); if so, it can be determined that the requirements of the hold time are met; if not, it can be determined that the requirements of the hold time are not met.

Figure 4:
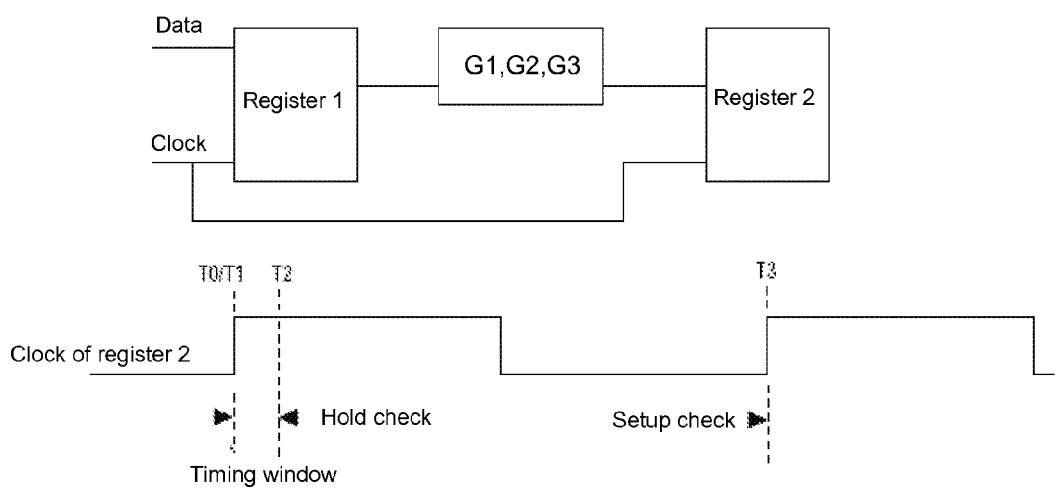
FIG. 4 is a schematic view of a timing window according to an embodiment of the present invention.

The concept of the timing window used in the embodiments of the present invention is explained as below. FIG. 4 is a schematic view of a timing window according to an embodiment of the present invention. In a digital circuit, a clock signal is a consecutive periodic signal one clock followed by another. Assuming that a data signal is sent at the rising edge of the first clock signal of the register 1, the hold check is performed at the rising edge of the first clock signal of the register 2 (the data cannot be earlier than T2), the setup check is performed at a rising edge of the second clock signal of the register 2 (the data cannot be later than T3), and the data is variable in the period from T2 to T3. The time period from T1 to T2 is called a window where the data can be sampled in timing, also called a timing window. The timing window is the larger the better. It is desirable that the later mode delay of the circuit delay is completely the same as the early mode delay, so the timing window can reach a maximum, for example, a clock cycle. However, in practice, the timing window in a chip is usually small, for example, the timing window is too small to sample the data according to the clock signal.

In an embodiment of the present invention, the timing window needed for a stable transmission of the data is set to be a predetermined timing window. If a timing window of the path of the chip design pattern is smaller than the predetermined timing window, it cannot ensure the stable transmission of data, and such a path is called the critical timing path, also called no timing window (NTW) path.

In the embodiment of the present invention, term "variation" is used to indicate uncertainty of the delay of the device and/or wire caused by at least one factor, such as voltage, temperature, and manufacturing. In the present invention, a variation of each segment of the critical timing path may be obtained in a plurality of ways, for example, by calculating a device parameter, by tool simulation, and so on. In a preferable embodiment of the present invention, the early mode delay value and late mode delay value of each segment of the critical timing path are obtained, and then a variation of each segment is obtained by determining a difference between the late mode delay value and the early mode delay value of each segment. The difference between the late mode delay value and the early mode delay value may be obtained in many ways, for example, the difference may be a subtraction value of the late mode delay value and the early mode delay value or a ratio of the late mode delay value to the early mode delay value.

Figure 1:
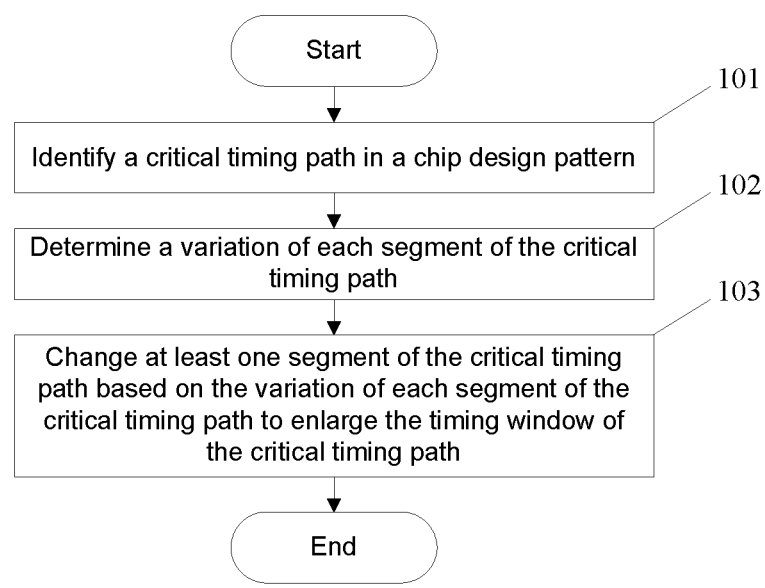
FIG. 1 illustrates a flow chart of a method for improving timing closure in the chip design according to an embodiment of the present invention.

FIG. 1 illustrates a flow chart of a method for improving timing closure in the chip design according to an embodiment of the present invention.

In Step 101, a critical timing path in the chip design pattern is identified, wherein the critical timing path refers to a path whose timing window is smaller than a predetermined timing window. As described above, if the timing window of a path in the chip design pattern is smaller than the predetermined timing window, this path is a critical timing path. A chip design pattern usually comprises one or more paths, and it can be judged whether each of the one or more paths is a critical timing path. Upon completion of judgment of all paths in the chip design pattern, it can be obtained a critical path set, which may comprise one or more critical paths or no critical path.

In one embodiment, it can be determined whether a path in the chip design pattern is a critical timing path based on timing analysis result of the chip design pattern. The timing analysis result can be obtained by using timing analysis tools in the art, such as PrimeTime purchased from Synopsys. Inc. located in California State of the United States. The generated timing analysis result can include many kinds of timing information, for example, paths included in the chip design pattern, the early mode timing slack and late mode timing slack of each of the paths, segments included in each of the paths, the early mode delay value and late mode delay value of each segment, and the like. The early mode timing slack refers to a quantized value of an early arrival time, and the late mode timing slack refers to a quantized value of a late arrival time. A positive timing slack value indicates that a current arrival time of a given node complies with all the downlink timing constraints; a negative timing slack value indicates that the arrival time cannot comply with at least one downlink timing constraint. The early mode timing slack and late mode timing slack of each of the paths in the chip design pattern can be obtained based on the timing analysis result, so that whether each of the paths is the critical timing path can be judged according to a predetermined policy.

In another embodiment, a device repository with descriptive information can be prepared in advance. Variations of devices in the repository and sequence of the devices are comprised in the descriptive information of the device repository. The device repository can be available from manufacturers or dealers of the devices, or obtained by those skilled in the art according to properties of the devices, or obtained by using any other method known by those skilled in the art. The early mode timing slack and the late mode timing slack of the paths in the chip design pattern may be obtained based on the device repository and the netlist, so that whether each of the paths is the critical timing path can be judged one by one based on a predetermined policy.

For example, the predetermined policy may be: weighting the late mode timing slack; summing the weighted late mode timing slack and the early mode timing slack; and determining the path as a critical timing path if the summation result is less than a predetermined timing slack threshold and the late mode timing slack is negative. Again, for example, the predetermined policy can be: weighting the early mode timing slack; summing the weighted early mode timing slack and the late mode timing slack; and determining the path a the critical timing path if the summation result is less than a predetermined timing slack threshold and the early mode timing slack is negative. The predetermined policy can be defined in advance in any proper manner or form, not limited to the above examples.

In Step 102, a variation of each segment of the critical timing path is determined. The method for determining the variation has been already stated as above, which will not be repeated herein any more.

In Step 103, at least one segment of the critical timing path is changed based on the variation of each segment of the critical timing path to enlarge the timing window of the critical timing path. In an embodiment, the critical timing paths are processed one by one based on the variation of each segment of the critical timing paths obtained in Step 102.

For a critical timing path, it is first necessary to know which segment(s) in the critical timing path has a larger variation. If the segments with larger variations are replaced with segments with smaller variations, the variation of the whole path can be reduced, and the width of the timing window of the path is increased. Therefore, the segments with larger variations can be determined as segments to be changed, and the segments as determined are changed to segments implementing the same functions and having lower variations. After one or more segments have been changed, the function of the critical timing path by no means changes, but its variation is reduced, thereby ensuring the stable transmission of the data.

In an embodiment, a device repository with its descriptive information can be prepared in advance, and variations of devices in the repository and the sequence of the devices are included in the descriptive information in the device repository. If the segment of the critical timing path is changed in Step 103, the variation of the segment to be changed can be determined first, and then a device with a lower variation is to be found from the device repository according to the descriptive information of the device repository. The device repository can be available from manufacturers or dealers of the devices, or obtained by those skilled in the art based on the properties of the devices, or obtained by any other method known by those skilled in the art.

Figure 2:
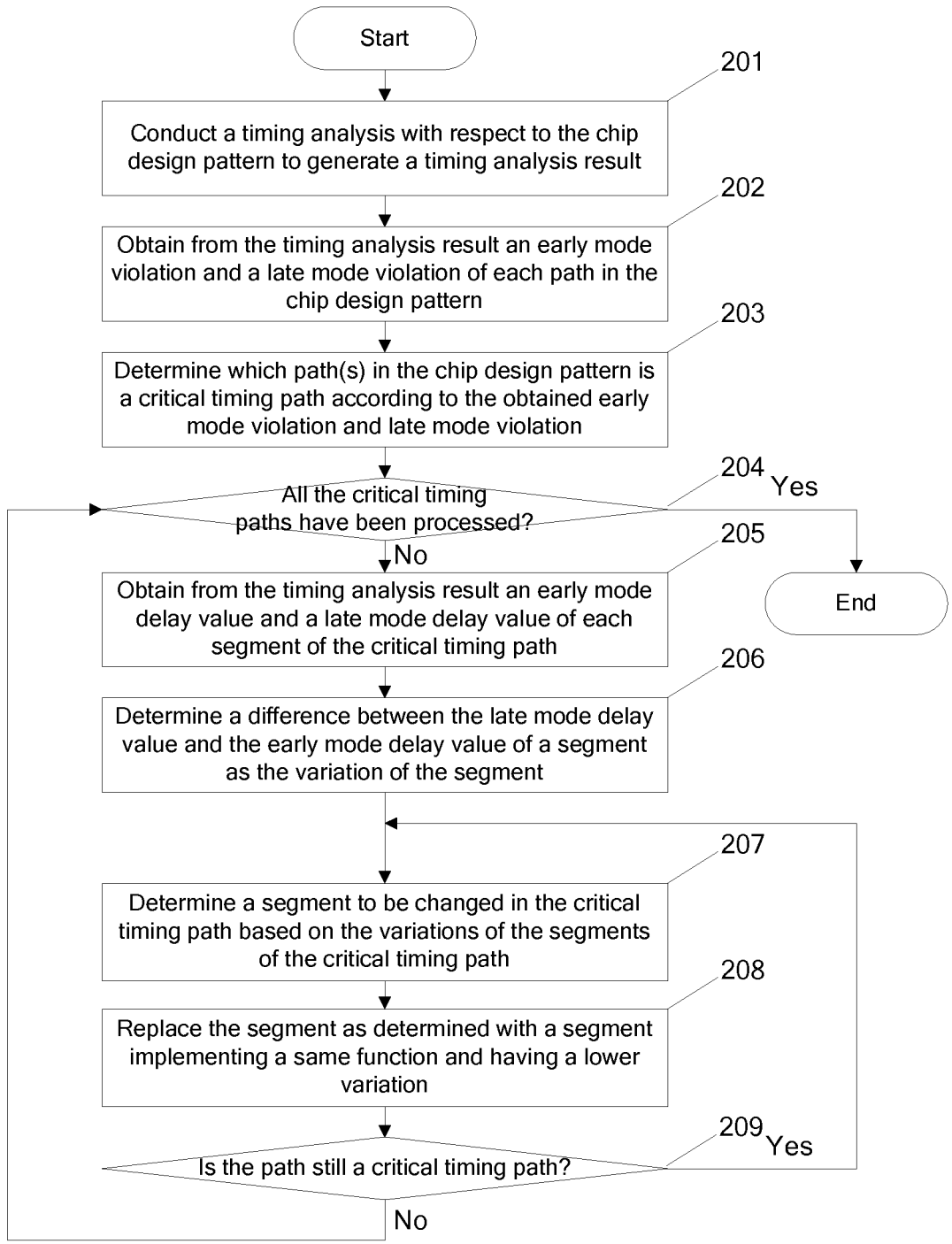
FIG. 2 illustrates a flow chart of a method for improving timing closure in the chip design according to another embodiment of the present invention.

FIG. 2 illustrates a flow chart of a method for improving timing closure in the chip design according to another embodiment of the present invention.

As shown in FIG. 2, in Step 201, timing analysis is conducted with respect to the chip design pattern to generate a timing analysis result. In this field, there exist a plurality of methods and tools for conducting timing analysis with respect to the chip design pattern. Those skilled in the art can generate the timing analysis result by using any known method.

It is noted that Step 201 is optional. Conducting the timing analysis with respect to the chip design pattern facilitates identification of the critical timing path in the chip design pattern and determination of the variation of each segment of the critical timing path. However, in other embodiments, the critical timing path in the chip design pattern can be identified and the variation of each segment of the critical timing path may be determined according to the device repository and netlist prepared in advance. Besides, the critical timing path in the chip design pattern can be identified by any other appropriate method known by those skilled in the art. The chip design pattern herein comprises results from netlist building, layout or wiring, and does not merely refer to a chip design document before being delivered for signing off.

In Step 202, the early mode timing slack and late mode timing slack of each path in the chip design pattern are obtained from the timing analysis result. In this step, the early mode timing slack and late mode timing slack of each path in the chip design pattern can be found from the timing analysis result generated in Step 201, and the found early mode timing slack and late mode timing slack can be used to judge whether the corresponding paths are critical timing paths.

In Step 203, it is determined which path(s) in the chip design pattern is a critical timing path according to the obtained early mode timing slack and late mode timing slack. In the description below, the early mode timing slack is denoted as Se and the late mode timing slack is denoted as S1 for the sake of simplicity. Whether a path is a critical timing path can be determined by judging whether the early mode timing slack Se and the late mode timing slack S1 comply with the predetermined policy.

In an example, the predetermined policy can be: weighting the late mode timing slack; summing the weighted late mode timing slack and the early mode timing slack; and determining the path as a critical timing path if the summation result is less than a predetermined timing slack threshold and the late mode timing slack is negative. The predetermined policy can be expressed by the following formula (1):

$$S1<0 \text{ and } a \times S1 + Se < M \tag{1}$$

wherein a is a general variation in a timing environment and depends on voltage, temperature and the like; and M is a pre-defined parameter which is defined according to process environment (for example, a value in nanometers) and usually set to be zero.

For example, assuming a=2 and M=0, if the early mode timing slack of a path Se=0.100 and the late mode timing slack S1=−0.100, the requirements of the formula (1) are met because a×S1+Se=2×(−0.100)+0.100<0 and S1<0, whereby the path can be determined to be a critical timing path. If the early mode timing slack of a path Se=0.300 and the late mode timing slack S1=−0.100, a×S1+Se<M as in the formula (1) is not met because a×S1+Se=2×(−0.100)+0.300>0, whereby the path can be determined not to be a critical timing path.

In another example, the predetermined policy can be: weighting the early mode timing slack; summing the weighted early mode timing slack and the late mode timing slack; and determining the path as a critical timing path if the summation result is less than a predetermined timing slack threshold and the early mode timing slack is negative. The predetermined policy can be expressed by the following formula (2):

$$Se<0 \text{ and } S1+b\times Se<M \quad (2)$$

wherein b is a general variation in a timing environment; and M is a pre-defined parameter and usually set to be zero.

It is noted that the above predetermined policy is only for illustrative purpose, and whether the path is the critical timing path can be judged according to any other appropriate predetermined policies.

In Step 204, it is judged whether all the critical timing paths have been processed. After Step 203, which paths are critical timing paths in the chip design pattern can be determined, so that a critical timing paths set can be obtained. Since there may be one or more critical timing paths or no critical timing path among the paths in the chip design pattern, the number N of paths in the critical timing paths set is greater than or equal to zero. If N=0, which indicates that the critical timing paths set is empty, it can be considered that processing of all the critical timing paths is finished, thereby the flow ends up. If N>0, which indicates there are one or more critical timing paths in the critical timing paths set, each of the critical timing paths is processed one by one by Steps 205-209 until all of the N paths are processed.

For example, assuming N=2, this indicates that in Step 203, two of the paths in the chip design pattern are determined as critical timing paths. When the flow reaches Step 204 for the first time, i.e., when the first critical timing path is being processed, a path counter i=1 and i<N, it can be determined that processing of all the critical timing paths is not yet finished, so Steps 205-209 are executed. Upon completion of Step 209, if the procedure returns to Step 204 again, the path counter is added 1, i.e., i=2 and i=N, it can be determined that processing of all the critical timing paths is still not yet finished, so Steps 205-209 are executed again. Upon completion of Step 209, if the procedure returns to step 204 again, the path counter is added 1, i.e., i=3 and i>N, whereby it can be determined that all the critical timing paths have already been finished, so the flow ends up.

In an embodiment, Steps 205-209 are respectively executed for each critical timing path in the critical timing path set. Generally speaking, Steps 205-209 are a procedure for determining a variation of each segment of the critical timing path based on the timing analysis result, and changing at least one of the segments of the critical timing path based on the variation of each segment of the critical timing path.

In Step 205, from the timing analysis result are obtained the early mode delay value and the late mode delay value of each segment of the critical timing path. As above stated, the timing analysis result can comprise the early mode delay values and the late mode delay values of the segments of the critical timing path. For the sake of simplicity, the early mode delay value is denoted as "DEM" and the late mode delay value as "DLM" in the following text. As stated in the preceding text, "segments" in the path can be devices or wires. Hence, the devices can have the early mode delay value DEM and the late mode delay value DLM, and the wire can have a DEM and a DLM.

In Step 206, a difference between the late mode delay value and the early mode delay value of a segment is determined as a variation of the segment. As above stated, the variation is used to indicate uncertainty of delay of the device and/or wire caused by factors such as voltage, temperature and manufacturing. The ratio of the late mode delay value to the early mode delay value can be regarded as the variation; the subtraction value between the late mode delay value and the early mode delay value can be regarded as the variation. For example, the variation of each segment can be calculated according to the following equation:

$$\text{Variation of a segment=late mode delay value of the segment−the early mode delay value of the segment} \quad (3)$$

Clearly, the variation of the device is equal to DLM of the device minus DEM, and the variation of the wire is equal to LDM of the wire minus DEM. For example, provided the late mode delay value of the device G1 in FIG. 3 is 600 ps and the early mode delay value is 400 ps, the variation of the device G1 can be obtained as 600 ps-400 ps=200 ps.

It is noted that the variation of the segment can be calculated in a manner beside the above equation (3). For example, by calculating a difference between the early mode delay value and the weighted late mode delay value, or a difference between the weighted early mode delay value and the late mode delay value, or by any other suitable methods.

In Step 207, a segment to be changed in the critical timing path is determined based on the variations of each segment of the critical timing path. There are many methods for determining a segment(s) to be changed in the critical timing path.

In one example, the variations of the segments in the critical timing path can be ranked, and the segment corresponding to a maximum variation in the critical timing path can be determined as the segment to be changed.

For example, assuming the path (A-D) in FIG. 3 is a critical timing path, it can be known from FIG. 3 that the critical timing path A-D comprises five segments, a wire AB, a device G1, a device G2, a device G3, and a wire CD. Assuming the variations of the segments are as shown in the following Table 1.

TABLE 1

Variations of Segments of Critical Timing Path A-D

| Path A-D | Wire AB | Device G1 | Device G2 | Device G3 | Wire CD |
|---|---|---|---|---|---|
| Variation | 50 ps | 200 ps | 100 ps | 130 ps | 20 ps |

It is known by ranking the variations of the above segments that the device G1 has a maximum variation, so the device G1 is determined as the segment to be changed.

In another example, the variation of the critical timing path can be obtained by summing the variations of the segments of the critical timing path; variation ratios of the variations of the segments to the variation of the critical timing path are calculated; and segment(s) in the critical timing path with a variation ratio higher than a predetermined threshold is determined as the segment to be changed.

For example, assuming the path (A-D) in FIG. 3 is a critical timing path, it is known from FIG. 3 that the critical timing path A-D comprises five segments, a wire AB, a device G1, a device G2, a device G3, and a wire CD. Assuming the variations of the segments and their ratios are as shown in the following Table 2:

TABLE 2

Variations of Segments of Critical Timing Path A-D and Their Ratios

| Path A-D | Wire AB | Device G1 | Device G2 | Device G3 | Wire CD |
|---|---|---|---|---|---|
| Variation ratio | 50 ps 10% | 200 ps 40% | 100 ps 20% | 130 ps 26% | 20 ps 4% |

In the example, assuming a predetermined threshold of variation ratio is 25%, there are two segments, i.e., the device G1 and the device G2, with variation ratios larger than the predetermined threshold. Therefore, the device G1 and the device G2 both can be determined as segments to be changed. In another embodiment, after the variation ratios are ranked, it can be determined that the segment corresponding to the maximum variation ratio is the only segment to be changed.

It is noted that a segment to be changed can be determined in a plurality of other suitable manners except for the above two examples. For example, variations of the segments of a critical timing path can be ranked, e.g., there are a total of three segments and two are wires and one is a device, then the segments with variations greater than the predetermined threshold are determined as segments to be changed. For example, one device and one wire in the three segments have variations greater than the predetermined threshold, so both of them are determined as the segments to be changed.

In Step 208, the segment as determined is replaced with a segment implementing a same function and having a lower variation. One of the purposes of the step is to replace segments with higher variations with segments with lower variations without affecting performance of the segments. If the segment to be changed as determined in Step 207 is a device, the device can be replaced with a device with a lower variation. In some examples, the device can be replaced with a wire in the case of not affecting the performance of the circuit.

If the segment to be changed as determined in Step 207 is a wire, such as a metal wire, the wire as determined can be replaced with a wider wire. Specifically, a wider wire can be achieved in many ways. For example, a higher metal layer can be employed because a wire with the higher metal layer usually has a wider wiring passageway meanwhile there are fewer passageways available for wiring. Further, a wider wire can be achieved by methods such as setting properties of the wire.

In Step 209, whether the path is still a critical timing path is judged. If a changed path is no more a critical timing path, the flow goes to Step 204 to process next critical timing path. If a changed path is still a critical timing path, Steps 207-209 will be repeated and segment(s) to be changed in the path will be determined again (Step 207), and whether the path after the change (Step 208) is the critical timing path is judged again (Step 209).

Figure 5:
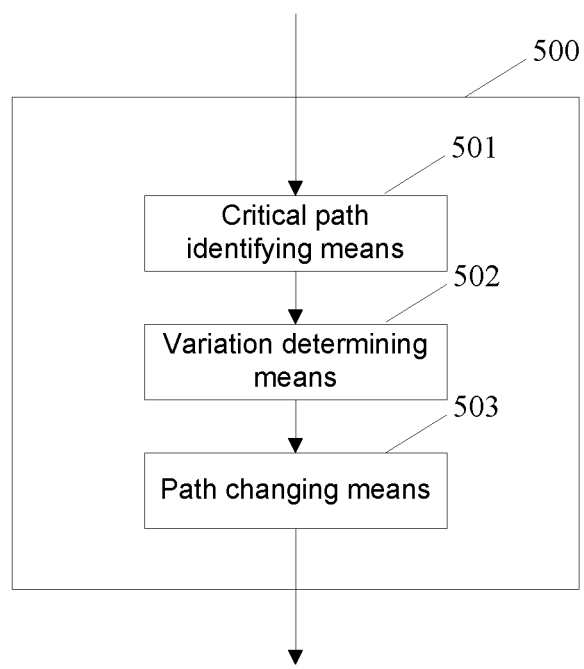
FIG. 5 illustrates a block diagram of a system for improving timing closure in the chip design according to another embodiment of the present invention.

FIG. 5 illustrates a block diagram of a system for improving timing closure in the chip design according to another embodiment of the present invention. As shown in FIG. 5, a system 500 may comprise: critical path identifying means 501, variation determining means 502 and path changing means 503. The system 500 may further comprise a timing analysis unit.

Critical path identifying means 501 is used to identify a critical timing path in a chip design pattern, wherein a timing window of the critical timing path is smaller than a predetermined timing window.

In an embodiment, the critical path identifying means 501 may comprise: means configured to acquire an early mode timing slack and a late mode timing slack of a path in the chip design pattern; means configured to weight the late mode timing slack; means configured to sum the weighted late mode timing slack and the early mode timing slack; and means configured to determine the path as a critical timing path if the summation result is less than a predetermined timing slack threshold and the late mode timing slack is negative.

In another embodiment, the critical path identifying means 501 can comprise: means configured to acquire an early mode timing slack and a late mode timing slack of a path in the chip design pattern; means configured to weight the early mode timing slack; means configured to sum the weighted early mode timing slack and the late mode timing slack; and means configured to determine the path as a critical timing path if the summation result is less than a predetermined timing slack threshold and the early mode timing slack is negative.

The variation determining means 502 is used to determine a variation of each segment of the critical timing path, wherein the variation indicates uncertainty of delay of a device and/or a wire caused by one or more factors. The variation determining means 502 can comprise: means configured to obtain the early mode delay value and the late mode delay value of each segment of the critical timing path; and means configured to determine a difference between the late mode delay value and the early mode delay value as a variation. The difference between the late mode delay value and the early mode delay value can be one of the following: a subtraction value between the late mode delay value and the early mode delay value, and a ratio of the late mode delay value to the early mode delay value.

The path changing means 503 is used to change at least one segment of the critical timing path based on the variation of each segment of the critical timing path to enlarge the timing window of the critical timing path. The path changing means 503 can comprise: a change determining unit for determining a segment to be changed in the critical timing path based on the variation of each segment of the critical timing path; and a replacing unit for replacing the segment as determined with a segment implementing a same function and having a lower variation.

In an embodiment, the change determining unit may comprise: means configured to rank the variations of the segments in the critical timing path; and means configured to determine a segment corresponding to a maximum variation in the critical timing path as the segment to be changed. In another embodiment, the change determining unit may comprise: means configured to obtain a variation of the critical timing path by summing the variations of the segments of the critical timing path; means configured to calculate a variation ratio of the variations of the segments to the variation of the critical timing path; and means configured to determine a segment in the critical timing path with a variation higher than a predetermined threshold as the segment to be changed.

In an embodiment, the replacing unit comprises: means configured to replace the device with a device or a wire having a lower variation if the segment as determined is a device, to enlarge the timing window of the critical timing path; and means configured to replace the wire with a wider wire if the segment as determined is a wire, to enlarge the timing window of the critical timing path.

In addition, the system 500 for improving timing closure in the chip design may further comprise: a timing analysis unit for conducting a timing analysis with respect to the chip design patter to generate timing analysis result so as to identify a critical timing path in the chip design pattern and determine variations of each segment of the critical timing path.

Additionally, the system 500 for improving timing closure in the chip design may further comprise: a device repository which can be obtained in advance. The device repository can have descriptive information which comprising variations of devices in the repository and sequence of the devices.

In the present invention, a "segment" can be a device or a wire. A "variation" indicates uncertainty of delay of the device and/or wire caused by one or more factors.

Figure 6:
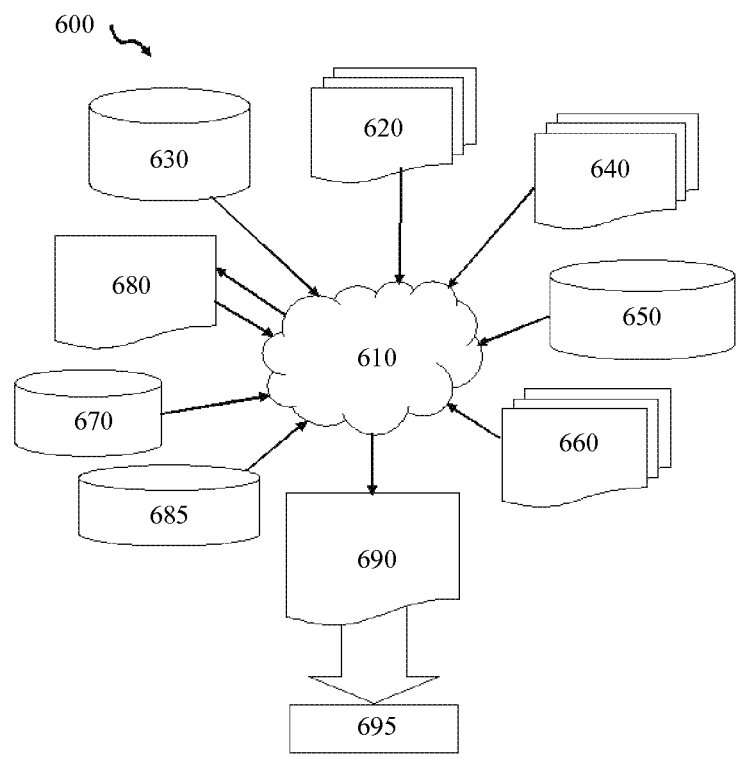
FIG. 6 illustrates a block diagram of a typical design procedure employed in semiconductor design, manufacturing and/or testing.

FIG. 6 illustrates a block diagram of a typical design flow for use, for example, in semiconductor design, manufacturing and/or testing. The design flow 600 may vary with a type of a designed IC. For example, a design flow 600 for constructing a special purpose integrated circuit may be different from a design flow 600 for designing a standard element. A design structure 620 is preferably an input of design process 610 and may be available from an IP provider, a core provider, or other design company, or generated by an operator of a design flow, or from other source. The design structure 620 comprises the embodiment of the present invention in a circuit diagram or HDL (hardware description language, for example, Verilog, VHDL, C, etc.). The design structure 620 may be embodied in one or more machine readable media. For example, the design structure 620 may be a textual document expression or a graphical expression of the embodiment of the present invention. Preferably, the design process 610 preferably synthesizes (or converts) the embodiment of the present invention to a netlist 680 which, here, is a list of, for example, links, transistors, logic gates, control circuits, I/O, module, etc, describing a connection of other element to a circuit in an integrated circuit design and being recorded on at least one machine readable medium. It may be a repetitive process. Based on the design specification and parameters of the circuit, the netlist 680 may be re-synthesized once or multiple times.

The design process 610 may comprise various kinds of inputs, for example, inputs from a repository element 630 which may accommodate a set of commonly used elements, circuits, and means and comprise modules, layouts, and symbol expressions, for a given manufacturing technology (for example, different technical nodes, 32 nm, 45 nm, and 90 nm, etc.); inputs from the design speciation 640, input from the feature calibration data 650, input from validation data 660, input from the design rule 670, and inputs from a testing data document 685 (which may comprise testing mode and other testing information). The design process 610 may further comprise, for example, a standard circuit design process such as timing analysis, validation, design rule check, layout, and wiring operation, etc. Without departing from the spirit and scope of the present invention, a person of normal skill in the art of integrated circuit design may understand the scope of possible electronic design automation tool and application used in the design process 610. The design structure of the present invention is not limited to any particular design flow.

The design process 610 preferably converts the embodiment of the present invention and any additional integrated circuit design or data (if applicable) to a second design structure 690. The design structure 690 is stored on a memory medium in a data format (for example, GDSII (GDS 2), GL 1, and OASIS, or information about storing this design structure in any other suitable format) for layout data exchange of an integrated circuit. The design structure 690 may comprise, for example, testing data document, design content document, manufacturing data, layout parameter, wiring, metal level, via, shape, data for addressing through a production line, or any other data required by a semiconductor manufacturer to produce the embodiment of the present invention. Then, the design structure 690 may proceed to Step 695, where the design structure 690, for example, is subject to tapeout, delivered for manufacturing, delivered to the mask workshop, delivered to another design workshop, returned to the client, etc.

Based on the above description, the skilled in the art would appreciate that the present invention may be embodied in an apparatus, a method, or a computer program product. Thus, the present invention may be specifically implemented in the following manners, i.e., complete hardware, complete software (including firmware, resident software, microcode, etc), or a combination of software part and hardware part as generally called "circuit," "module," or "system" herein. Further, the present invention may also adopt a form of computer program product as embodied in any tangible medium of expression, the medium comprising computer-usable program code.

Any combination of one or more computer-usable or computer-readable mediums may be used. The computer-usable or computer-readable medium may be for example, but not limited to, electrical, magnetic, optical, electromagnetic, infrared, or semiconductor system, means, device, or propagation medium. More specific examples (non-exhaustive list) of the computer-readable medium comprise: an electric connection having one or more leads, a portable computer magnetic disk, hard disk, random access memory (RAM), read-only memory (ROM), erasable programmable read-only memory (EPROM or flash), optical fiber, portable compact disk read-only memory (CD-ROM), optical storage device, a transmission medium for example, supporting internet or intranet, or a magnetic storage device. It should be noted that the computer-usable or computer readable medium may even be a paper printed with a program thereon or other suitable medium, because the program may be obtained electronically by electrically scanning such paper or other medium, and then compiled, interpreted or processed in a suitable manner, and if necessary, stored in a computer memory. In the context of the present document, a computer-usable or computer-readable medium may be any medium containing, storing, communicating, propagating, or transmitting a program available for an instruction execution system, apparatus or device, or associated with the instruction execution system, apparatus, or device. A computer-usable medium may comprise a data signal contained in a base band or propagated as a part of carrier and embodying a computer-usable program code. A computer-usable program code may be transmitted by any suitable medium, including, but not limited to, radio, wire, cable, or RF, etc.

A computer program code for executing operations of the present invention may be written by any combination of one or more program design languages, the program design languages including object-oriented program design languages, such as Java, Smalltalk, C++, etc, as well as conventional procedural program design languages, such as "C" program design language or similar program design language. A program code may be completely or partly executed on a user computer, or executed as an independent software package, partly executed on the user computer and partly executed on a remote computer, or completely executed on a remote computer or server. In the latter circumstance, the remote computer may be connected to the user computer through various kinds of networks, including local area network (LAN) or wide area network (WAN), or connected to external computer (for example, by means of an internet service provider via Internet).

Further, each block in the flow charts and/or block diagrams of the present invention and combination of respective blocks therein may be implemented by computer program instructions. These computer program instructions may be provided to a processor of a general purpose computer, a dedicated computer or other programmable data processing apparatus, thereby generating a machine such that these instructions executed through the computer or other programmable data processing apparatus generate means configured to implement functions/operations prescribed in the blocks of the flow charts and/or block diagrams.

These computer program instructions may also be stored in a computer-readable medium capable of instructing the computer or other programmable data processing apparatus to work in a particular manner, such that the instructions stored in the computer-readable medium generate a product including instruction means configured to implement the functions/operations prescribed in the flow charts and/or block diagrams.

The computer program instructions may also be loaded on a computer or other programmable data processing apparatus, such that a series of operation steps are implemented on the computer or other programmable data processing apparatus, to generate a computer-implemented process, such that execution of the instructions on the computer or other programmable apparatus provides a process of implementing the functions/operations prescribed in the blocks of the flow charts and/or block diagrams.

Though the exemplary embodiments of the present invention are described herein with reference to the drawings, it should be understood that the present invention is not limited to these accurate embodiments, and a person of normal skill in the art can make various modifications to the embodiments without departing from the scope and principle of the present invention. All such variations and modifications are intended to be included in the scope of the present invention as defined in the appended claims.

What is claimed is:

1. A method of improving timing closure in chip design, comprising:
   identifying a critical timing path in a chip design pattern, wherein a timing window of the critical timing path is smaller than a predetermined timing window;
   determining a variation of each segment of the critical timing path, wherein the variation indicates uncertainty of delay of a device and/or a wire caused by one or more factors; and
   changing at least one segment of the critical timing path based on the variation of each segment of the critical timing path to enlarge the timing window of the critical timing path; and
   wherein determining a variation of each segment of the critical timing path comprises:
   obtaining an early mode delay value and a late mode delay value of each segment of the critical timing path; and
   determining a difference between the late mode delay value and the early mode delay value as the variation wherein one or more steps are performed by a computer.

2. The method according to claim 1, wherein the difference between the late mode delay value and the early mode delay value comprises one of:
   a subtraction value between the late mode delay value and the early mode delay value, and
   a ratio of the late mode delay value to the early mode delay value.

3. The method according to any one of claims 1-2, wherein changing at least one segment of the critical timing path based on the variation of each segment of the critical timing path comprises:
   determining a segment to be changed in the critical timing path based on the variation of each segment of the critical timing path; and
   replacing the segment as determined with a segment implementing a same function and having a lower variation.

4. The method according to claim 3, wherein determining a segment to be changed in the critical timing path based on the variation of each segment of the critical timing path comprises:
   ranking variations of the segments in the critical timing path; and
   determining a segment corresponding to a maximum variation in the critical timing path as the segment to be changed.

5. The method according to claim 3, wherein determining a segment to be changed in the critical timing path based on the variation of each segment of the critical timing path comprises:
   obtaining a variation of the critical timing path by summing variations of the segments of the critical timing path;
   calculating a variation ratio of the variation of each segment to the variation of the critical timing path; and
   determining a segment in the critical timing path with a variation ratio higher than a predetermined threshold as the segment to be changed.

6. The method according to claim 3, wherein replacing the segment as determined with a segment implementing a same function and having a lower variation comprises:
   if the segment as determined is a device, replacing the device with a device or a wire having a lower variation to enlarge the timing window of the critical timing path; and
   if the segment as determined is a wire, replacing the wire with a wider wire to enlarge the timing window of the critical timing path.

7. The method according to claim 1, wherein identifying a critical timing path in a chip design pattern comprises:
   obtaining an early mode timing slack and a late mode timing slack of a path in the chip design pattern;
   weighting the late mode timing slack;
   summing the weighted late mode timing slack and the early mode timing slack; and
   determining the path as a critical timing path if the summation result is less than a predetermined timing slack threshold and the late mode timing slack is negative.

8. The method according to claim 1, wherein identifying a critical timing path in a chip design pattern comprises:
   obtaining an early mode timing slack and a late mode timing slack of a path in the chip design pattern;
   weighting the early mode timing slack;
   summing the weighted early mode timing slack and the late mode timing slack; and
   determining the path as a critical timing path if the summation result is less than a predetermined timing slack threshold and the early mode timing slack is negative.

9. The method according to claim 1, wherein before identifying a critical timing path in the chip design pattern the method further comprises:

conducting a timing analysis with respect to the chip design pattern to generate a timing analysis result.

10. A system for improving timing closure in chip design, comprising:
   critical path identifying means configured to identify a critical timing path in a chip design pattern, wherein a timing window of the critical timing path is smaller than a predetermined timing window;
   variation determining means configured to determine a variation of each segment of the critical timing path, wherein the variation indicates uncertainty of delay of a device and/or a wire caused by one or more factors; and
   path changing means configured to chance at least one segment n path based on the variation of each segment of the critical timing path to enlarge the timing window of the critical timing path; and
   wherein the variation determining means comprises:
   means configured to obtain an early mode delay value and a late mode delay value of each segment of the critical timing path; and
   means configured to determine a difference between the late mode delay value and the early mode delay value as the variation.

11. The system according to claim 10, wherein the difference between the late mode delay value and the early mode delay value comprises one of:
   a subtraction value between the late mode delay value and the early mode delay value, and
   a ratio of the late mode delay value to the early mode delay value.

12. The system according to any one of claims 10-11, wherein the path changing means comprises:
   a change determining unit for determining a segment to be changed in the critical timing path based on the variation of each segment of the critical timing path; and
   a replacing unit for replacing the segment as determined with a segment implementing a same function and having a lower variation.

13. The system according to claim 12, wherein the change determining unit comprises:
   means configured to rank variations of the segments in the critical timing path; and
   means configured to determine a segment corresponding to a maximum variation in the critical timing path as the segment to be changed.

14. The system according to claim 12, wherein the change determining unit comprises:
   means configured to obtain a variation of the critical timing path by summing variations of the segments of the critical timing path;
   means configured to calculate a variation ratio of the variation of each segment to the variation of the critical timing path; and
   means configured to determine a segment in the critical timing path with a variation ratio higher than a predetermined threshold as the segment to be changed.

15. The system according to claim 12, wherein the replacing unit comprises:
   means configured to replace the device with a device or a wire having a lower variation if the segment as determined is a device, to enlarge the timing window of the critical timing path; and
   means configured to replace the wire with a wider wire if the segment as determined is a wire, to enlarge the timing window of the critical timing path.

16. The system according to claim 10, wherein the critical path identifying means comprises:
   means configured to obtain an early mode timing slack and a late mode timing slack of a path in the chip design pattern;
   means configured to weight the late mode timing slack;
   means configured to sum the weighted late mode timing slack and the early mode timing slack; and
   means configured to determine the path as a critical timing path if the summation result is less than a predetermined timing slack threshold and the late mode timing slack is negative.

17. The system according to claim 10, wherein the critical path identifying means comprises:
   means configured to obtain an early mode timing slack and a late mode timing slack of a path in the chip design pattern;
   means configured to weight the early mode timing slack;
   means configured to sum the weighted early mode timing slack and the late mode timing slack; and
   means configured to determine the path as a critical timing path if the summation result is less than a predetermined timing slack threshold and the early mode timing slack is negative.

* * * * *